United States Patent [19]

Dennis

[11] Patent Number: 5,253,415
[45] Date of Patent: Oct. 19, 1993

[54] METHOD OF MAKING AN INTEGRATED CIRCUIT SUBSTRATE LEAD ASSEMBLY

[75] Inventor: Richard K. Dennis, Etters, Pa.

[73] Assignee: Die Tech, Inc., York Haven, Pa.

[21] Appl. No.: 944,347

[22] Filed: Sep. 14, 1992

Related U.S. Application Data

[62] Division of Ser. No. 496,215, Mar. 20, 1990, abandoned.

[51] Int. Cl.$^5$ ............................................ B23P 15/00
[52] U.S. Cl. .................................. 29/827; 29/840; 174/522; 174/524
[58] Field of Search .................. 29/827, 840, 850; 361/398, 400, 404, 405, 406, 408, 409, 411, 417, 419, 420, 421; 174/52.2, 52.4; 357/70; 437/206, 209; 156/161, 166, 176, 178, 292

[56] References Cited

U.S. PATENT DOCUMENTS

| | | | |
|---|---|---|---|
| 3,674,602 | 7/1972 | Keogh et al. | 156/380 |
| 3,674,914 | 7/1972 | Burr | 174/68.5 |
| 3,816,205 | 6/1974 | Krag | 156/178 |
| 3,882,597 | 5/1975 | Chayka et al. | 29/624 |
| 4,140,265 | 2/1979 | Morino | 228/180 |
| 4,171,477 | 10/1979 | Funari | 219/56 |
| 4,450,623 | 5/1984 | Burr | 29/850 |
| 4,541,882 | 9/1985 | Lassen | 156/150 |
| 4,651,415 | 3/1987 | Frampton | 29/827 |
| 4,653,174 | 3/1987 | Gilder, Jr. et al. | 29/574 |
| 4,704,187 | 11/1987 | Fujita | 156/645 |
| 4,711,700 | 12/1987 | Cusack | 156/651 |
| 4,733,292 | 3/1988 | Jarvis | 357/70 |
| 4,790,897 | 12/1988 | Long | 29/850 |
| 4,790,898 | 12/1988 | Woods | 156/166 |
| 4,806,106 | 2/1989 | Mebane et al. | 29/827 |
| 4,814,855 | 3/1989 | Hodgson et al. | 174/52 |
| 4,820,658 | 4/1989 | Gilder, Jr. et al. | 29/827 |
| 4,839,717 | 6/1989 | Phy et al. | 357/74 |
| 4,859,614 | 8/1989 | Sugahara et al. | 437/8 |
| 4,870,474 | 9/1989 | Karashima | 357/70 |
| 4,899,207 | 2/1990 | Hallowell et al. | 357/70 |
| 4,918,260 | 4/1990 | Griffith et al. | 29/850 |
| 4,933,810 | 6/1990 | Cardashian et al. | 361/398 |
| 4,949,224 | 8/1990 | Yamamura et al. | 361/412 |
| 4,967,261 | 10/1990 | Niki et al. | 357/70 |
| 4,979,663 | 12/1990 | Sofia et al. | 228/180 |
| 4,981,817 | 1/1991 | Stone, Jr. | 437/206 |
| 4,985,748 | 1/1991 | Belanger, Jr. | 357/69 |
| 5,053,922 | 10/1991 | Matta et al. | 361/386 |
| 5,061,988 | 10/1991 | Rector | 357/74 |
| 5,113,580 | 5/1992 | Schroeder | 29/840 |
| 5,152,056 | 10/1992 | Shook | 29/840 |

*Primary Examiner*—Irene Cuda
*Attorney, Agent, or Firm*—Thomas Hooker

[57] ABSTRACT

A lead assembly and method for forming electrical connections between pads on an integrated circuit chip and pads on a circuit board includes small diameter wires adhesively bonded to a supporting tape. The wires may be inwardly fanned to form connections between relatively widely spaced circuit board pads and relatively closely spaced chip pads.

19 Claims, 9 Drawing Sheets

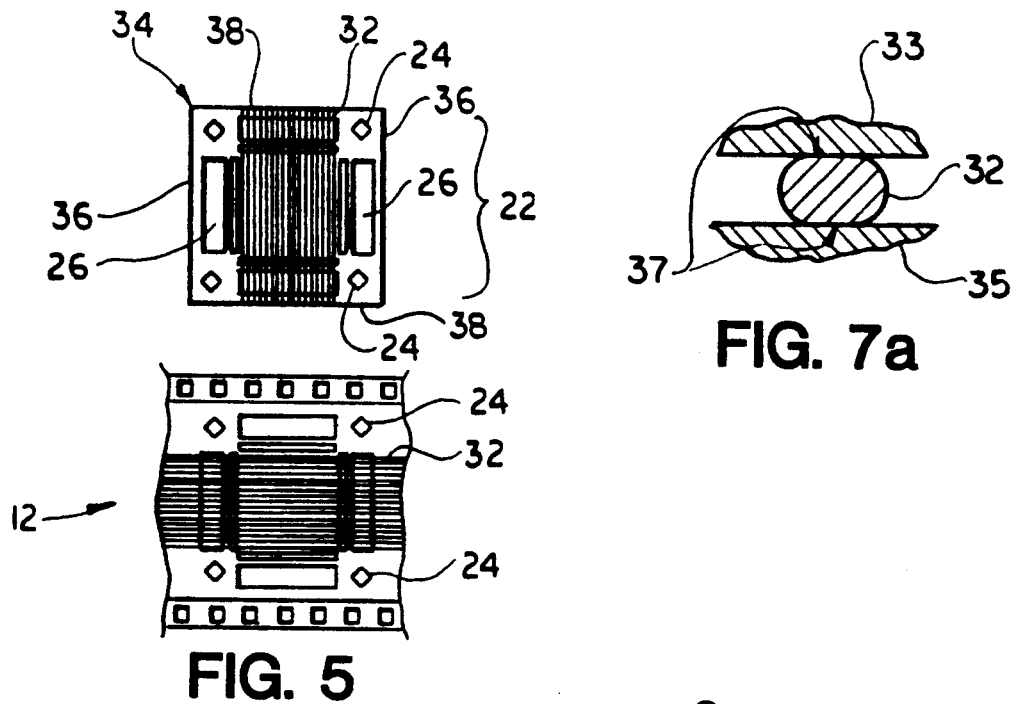
FIG. 7a
FIG. 5
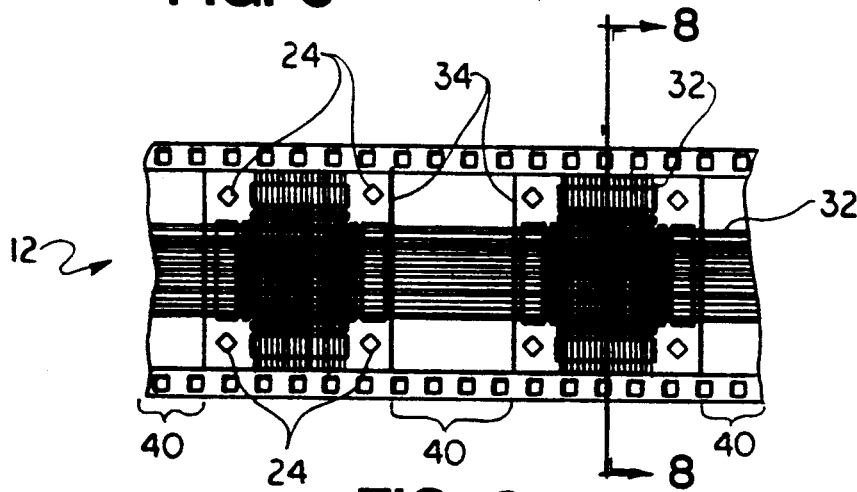
FIG. 6
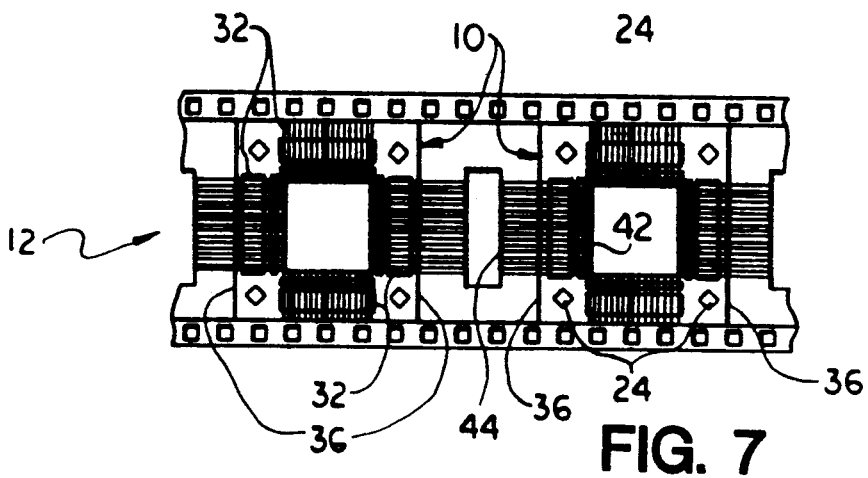
FIG. 7

METHOD OF MAKING AN INTEGRATED CIRCUIT SUBSTRATE LEAD ASSEMBLY

This is a division of application Ser. No. 496,215, filed Mar. 20, 1990, abandoned.

FIELD OF THE INVENTION

The invention relates to lead assemblies used for forming electrical connections between contact pads on supporting circuit boards or panel members and contact pads on integrated circuit substrate chips and methods for manufacturing lead assemblies.

DESCRIPTION OF THE PRIOR ART

Connections between contact pads on circuit boards and contact pads on integrated substrate chips are now made by lead frames having a plurality of flat contact tabs. Conventional lead frame assemblies are stamped-formed from thin sheet metal stock have flat, uniform thickness metal tabs which form electrical connections between circuit board pads and contact pads on integrated circuit chips. Using the best technology it is possible to stamp-form a lead frame having chip pad contact tabs with a width of about 0.010 inch and a gap between adjacent tabs of about 0.010 inch. These tabs may be used for forming electrical connections with IC chip pads having a center-to-center spacing of 0.020 inch.

Improved manufacture techniques now permit manufacture of integrated circuits with contact pads having a center-to-center spacing from 0.004 to 0.006 inch. It is not possible to stamp lead frame assemblies to form tabs for making electrical connections with these closely spaced chip pads.

Lead frame assemblies are also manufactured by etching away non-masked portions of a thin metal foil in order to form an assembly having closely spaced tabs for bonding to closely spaced integrated circuit pads. While it is possible to etch relatively small lead frame tabs from sheet metal foil, the etching process undercuts the tabs and often produces inaccurately located tabs which do not align with the chip pads and are unusable for bonding to closely spaced pads.

An additional problem experienced in stamped and etched lead frame assemblies is that the resultant flat tabs have a large area surface contact with the flat chip pads and are difficult to bond to the pads. Ideal bonding occurs when initial contact between the lead frame assembly tabs and the pad occurs at a relatively small area contact which expands in area during bonding. The difficulty in bonding flat, stamped or etched tabs to integrated circuit pads has caused some manufacturers to add specially formed contact dots on the tabs to provide an initial low area dot contact with the chip pads. While this expedient does work, it adds appreciably to the cost of the lead frame assemblies.

The manufacture of stamped and etched lead frame assemblies produces considerable scrap metal. Each of these assemblies is formed from a metal sheet. In the stamped lead frame assemblies, metal is mechanically removed from the sheet. In the etched lead frame assemblies metal is chemically removed. All of the removed metal is waste. Considerable cost is invested in accurately removing the waste metal. These factors undesirably increase the cost of conventional lead frame assemblies.

SUMMARY OF THE INVENTION

The invention relates to a integrated circuit substrate lead assembly in which very small diameter cylindrical wire filament conductors form electrical connections between the circuit board pads and pads on the substrate or chip. The filaments are held in place in the assembly by an adhesive-coated plastic tape having windows or slots at appropriate locations to permit direct bonding of the filaments to the printed circuit an integrated circuit pads. The filaments ar readily bonded to the pads by tools which first force the filaments into engagement with the flat pads at desired low area contacts and then form reliable electrical connections between the filaments and pads. Flat contact surfaces may be provided on the filaments to prevent shifting during bonding.

The filaments used in the lead assembly have a small diameter of about 0.001 inch to 0.003 inch. In one embodiment, the filaments are adhered to the tape in a parallel array having a center-to-center spacing of 0.010 inch. Two sections of tape, each carrying a parallel array of filaments, are adhered to each other with the filaments extending perpendicular to each other, and with contact windows formed across the filaments at the ends of each array. The arrays cross over each other at a center area which is blanked from the assembly in order to electrically isolate individual filaments. The lead assembly is used to form electrical connections between circuit board and integrated circuit pads each spaced apart by a relatively large distance of 0.010 inch.

Other embodiment lead assemblies are similar to the first embodiment lead assembly with the exception that the filaments at the center of each assembly are fanned inwardly and have a close center-to-center spacing along the edges of the square center cut. When 0.001 inch diameter wire filament is used connections can be made with substrate pads spaced apart center-to-center as close as 0.004 inch. The filaments on the outer edges of the lead assembly may be spaced apart as far as necessary to make electrical connections with pads on a printed circuit board or panel. Individual filaments are easily bent during manufacturing to permit inward fanning of the array to a desired pattern prior to adhering the array to the supporting tape.

The filament lead assemblies are manufactured economically with very little waste metal. Almost all of the filament adhered to the tape is used in the lead assemblies. While some filament is discarded, the amount of waste metal occurring in the manufacture of the present lead assembly is insignificant in comparison to the metal wasted in the manufacture of conventional stamped or etched lead frame assemblies. Additionally, the lead assembly is quickly manufactured with a minimum expense and time.

Other objects and features of the invention will become apparent as the description proceeds, especially when taken in conjunction with the accompanying drawings illustrating the invention, of which there are nine sheets and three embodiments.

DESCRIPTION OF THE DRAWINGS

FIGS. 1 through 8 illustrate the manufacture of a first embodiment lead assembly with closely spaced parallel filament conductors for use in forming electrical connections between circuit board pads and chip pads having the same center-to-center spacing;

DESCRIPTION OF THE PREFERRED EMBODIMENTS

Figure 1:
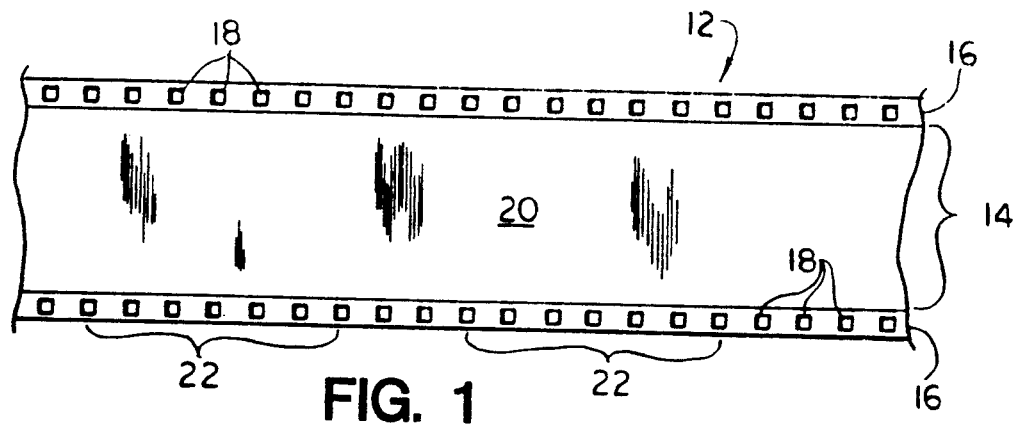

FIG. 1 illustrates a portion of an indefinite length of strong flexible insulating plastic tape 12 used in manufacturing lead assembly 10. The tape preferably is strong and flexible with a thickness of about 0.001 inch. The tape may be made of a polyamide plastic, another plastic or other suitable insulating material.

Tape 12 includes a flat central portion 14 with attached edge strips 16 carrying regularly spaced pilot holes 18 used to feed the tape during the manufacturing process. A layer of adhesive 20 is applied to one side of central portion 14. The adhesive may be sticky at room temperature or may be of a high temperature type such as acrylic based cement which becomes sticky when heated. If a room temperature sticky adhesive is used, it may be necessary to lay a protective layer, such as a waxed paper strip, over the adhesive during punching of the tape to form the openings illustrated in FIG. 2. This layer is removed following the punching operation.

Figure 2:
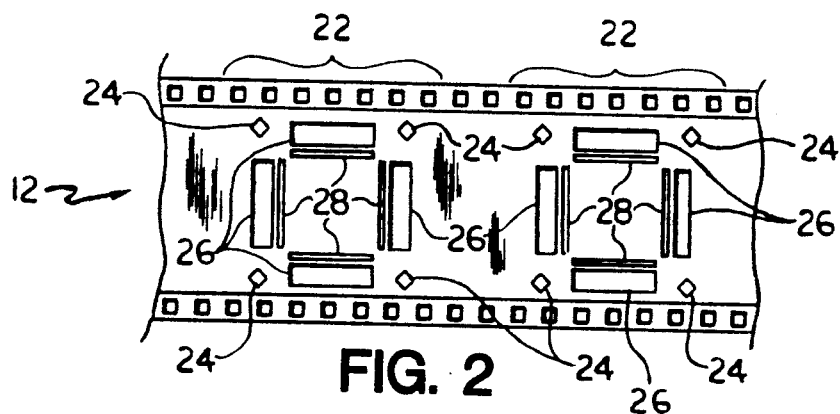
Figure 15:
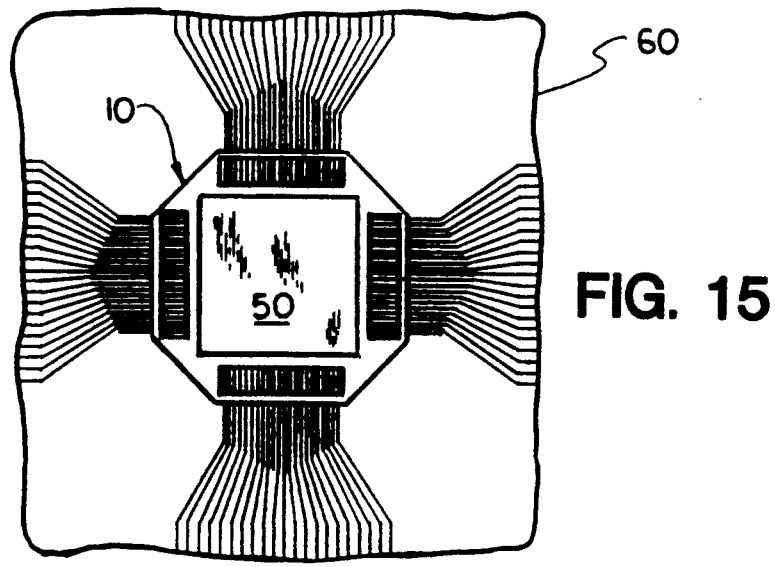

Lead assemblies 10, shown in FIG. 15, are manufactured on tape 12 at regular intervals 22 spaced along the length of the tape. FIG. 2 illustrates a portion of tape 12 after a punching operation forms a set of openings through the tape at each lead assembly interval 22. A set of square alignment holes 24 is formed through the tape at the corners of each interval adjacent edge strips 16. Four wide circuit board contact slots or windows 26 are punched through the tape. These slots extend along the sides of a square and are arranged in the same square pattern as contacts on the circuit board on which the lead assembly will be mounted. Four narrow chip contacts slots or windows 28 are punched through the tape a short distance inside the wide circuit board contact slots and conform to the pattern of contact pads on the integrated circuit chip subsequently bonded to lead assembly 10. Slots 26 and 28 are the same length.

Following punching of the tape as indicated in FIG. 2, a parallel array 30 of regularly spaced, small diameter wire filaments 32 extending above and along the tape is adhered to the adhesive 20. The width of the array is slightly less than the length of the slots 26 and 28 which extend across the width of the tape so that each filament passes across each of the transverse slots 26 and 28. The individual filaments may have a diameter as small as 0.001 yo 0.003 inch. Adjacent filaments may have a center-to-center spacing of 0.010 inch. The filaments form electrical connections between contact pads on the integrated circuit and the circuit board. The number of filaments in the array and the length of the slots in tape 12 depend upon the number and size of the chip and circuit board pads to which the filaments are subsequently bonded. The thin filament filaments 32 may be made of copper, aluminum or other suitable conductive materials and may be plated if required.

Figure 4:
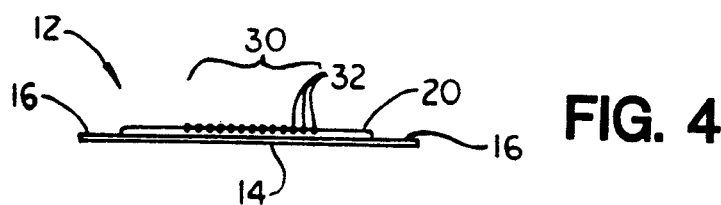

In the case adhesive 20 is of the room temperature sticky type requiring a protective layer during the stamping step, the layer is removed prior to adhering the filament array to the tape. In the case the adhesive 20 is of the high temperature acrylic type the adhesive is heated prior to bringing the filaments into contact with the adhesive. In either event, the adhesive bonds individual filaments 32 in place on the tape in the parallel array and holds the filaments in place extending across slots 26 and 28 during subsequent manufacturing operations. FIG. 4 illustrates that the filaments 32 are preferably half immersed in the adhesive 20 and are maintained in parallel aligned position on the tape.

Figure 3:
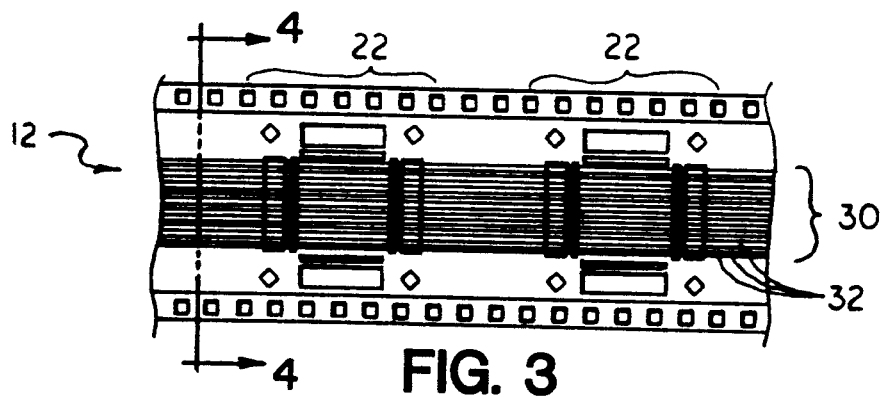

FIG. 5 shows a segment 34 of the tape of FIG. 3 including a single lead assembly interval of punched slots and holes with adhered filaments 32. The segment 34 has been removed from the tape 12 and edges 16 have been removed at lines 36 located outwardly of adjacent wide slots 26. The segment is rotated 90 degrees with respect to an adjacent set of holes and slots in tape 12 so that the filaments 32 in segment 34 extend perpendicular to the filaments 32 in tape 12. Segments 34 have been cut from a length of tape 12 along lines 38 located adjacent transverse wide slots 26.

FIG. 6 illustrates tape 12 with a pair of tape segments 34 adhered to the surface of the tape with the slots and pilot holes in the tape and the segment aligned over each other. Each segment 34 is positioned parallel over the tape 12 with segment filaments 32 oriented perpendicular to tape filaments 32 and with the slots and cutout holes 24, 26 and 28 in the tape and segment in alignment. The adhesive layers carried by the segment and by the tape face each other so that upon lowering of the segment onto the tape the adhesive secures and holds the segment in place with the individual filaments 32 in each array intersecting each other at the central portion located inwardly of the aligned narrow inner chip contact slots 28. During attachment, the segment is held in proper alignment with the tape by tools extending through openings 24. When adhesive 20 is of the room temperature sticky type, the segments 34 are aligned and then lowered into contact with the tape. When the adhesive 20 is the high temperature type both adhesive layers must be heated prior to adhering the segments to the tape. After segments 34 are adhesively bonded on the tape, the tape may be fed through a suitable bath to dissolve and remove the adhesive adhered to the tape at areas 40 between adjacent tape segments. Removal of the sticky adhesive facilitates the subsequent punching operation illustrated in FIG. 7.

Figure 8:

FIG. 8 is a generalized sectional view illustrating the sandwich construction of tape 12 with an adhered tape segment 34 and intersecting filaments 32.

FIG. 7 illustrates tape 12 following a punching operation which forms a square cut out 42 in the center of each lead assembly having edges a short distance inwardly of the narrow chip contact slots 28 to remove the portion of the tape-segment sandwich carrying the overlying and intersecting arrays of parallel filaments 32. Punching of the cut out 42 severs filaments 32 away from the narrow slots 28 without disturbing the positions of the filaments in the slots.

The punching operation also forms a long cut out slot 44 between adjacent intervals 22 on the tape 12. Slots 44 electrically isolate the filaments extending along the length of tape 12 between adjacent lead assemblies.

The punching operation of FIG. 7 completes manufacture of individual lead assemblies 10 on continuous tape 12. Such lead assemblies includes four sets of parallel filaments 32 extending away from the central cut out 42. The filaments are exposed at the wide and narrow slots 26 and 28. The filaments are held in place by the adhesive between the tape 12 and the segment 34. Each filament is electrically isolated from adjacent filaments so that the electrical continuity of the filaments in the lead assembly may be easily tested by use of probes extended to contact the exposed filaments in the slots or windows.

The cylindrical wire filaments 32 extend across windows 26 and 28. These filaments are subsequently forced against and bonded to flat circuit board and chip contact pads by tooling which engages the side of the filaments away from the pads and forces the filaments onto the pads. As described, the filaments have a small diameter of from about 0.001 to 0.003 inch. The chip contact pads are relatively small in size thereby requiring the filaments be held against lateral shifting during the bonding operation. Direct forcing of the cylindrical filaments against the pads, with resultant initial line or dot contact between the filaments and the pads, can result in rolling or sliding of the filaments laterally across the pads. For instance, slight misalignment of the bonding tooling relative to the pads could cause lateral shifting of the filaments. Lateral shifting of the filaments is undesirable and can result in improper electrical bonds between the filaments and the pads. Extreme cases of lateral shifting can result in filaments being bonded to the wrong pads. The very small center-to-center spacing of chip contact pads ranging from about 0.004 to 0.006 inch requires that the filaments be positioned accurately over the proper pads and be bonded directly to the pads without shifting.

Figure 10:
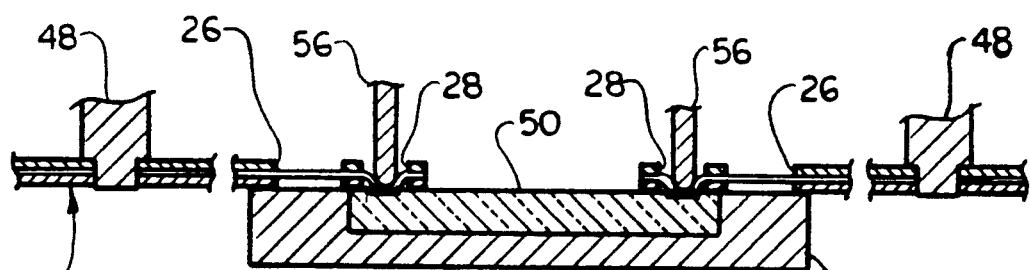
Figure 11:
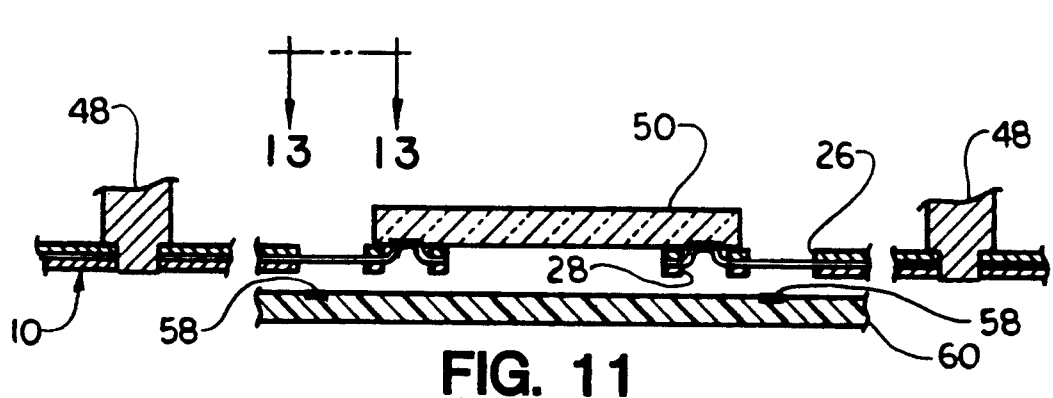
Figure 12:
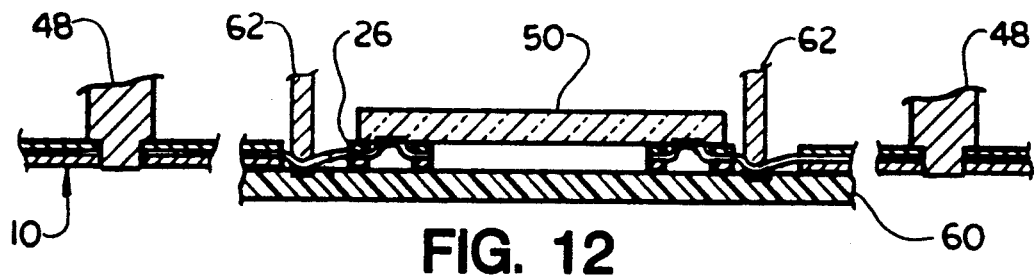

Lateral shifting of filaments during bonding may be reduced by enlarging the initial area of contact between the filaments and the pads in order to increase frictional forces resisting shifting. FIG. 7a illustrates tooling used to flatten the filaments 32 extending freely across the windows 26 and 28. This tooling includes a flat base surface 35 positioned in each window with the filaments resting on the surface. Flat tooling 33 located on the opposite side of the filaments is lowered into each window to engage filaments 32 and reduce the height of the filaments thereby forming flat surfaces 37 on both sides of the filaments. These surfaces face outwardly from the windows. During bonding of the filaments to the chip and circuit board pads as shown in FIGS. 10 and 12 the bonding tooling engage the filaments from one side of the windows and forces the flattened surfaces 37 on the opposite sides of the filaments flush against the pads without lateral shifting.

Upon completion and manufacture of lead assemblies 10 along the tape 12, individual lead assemblies are severed from the tape 12 by removing edge strips 16 and transversely cutting the tape at the edges of the segments 34 along lines 36. During the subsequent mounting operation the individual lead assemblies 10 are carried and located by four fingers 48 which extend into the alignment holes 24 in the lead assembly.

Figure 9:
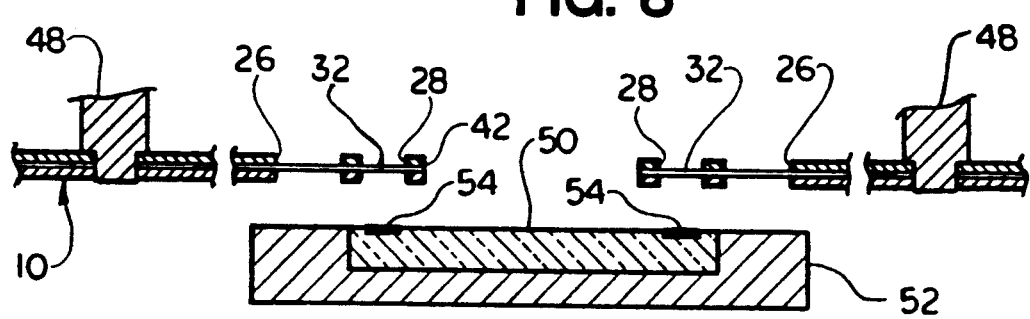
FIGS. 9, 10, 11 and 12 are sectional views illustrating the steps in connecting the lead assembly manufactured according to FIGS. 1 through 8 to an integrate circuit chip.

FIG. 9 shows lead assembly 10 supported by fingers 48 positioned over integrated circuit chip 50 positioned on support 52. Chip 50 is square and includes four rows of regularly spaced contact pads 54 along and slightly inside each side edge. There are the same number of contacts on each side of chip 50 as there are filaments extending along each side of the lead assembly 10. The center-to-center spacing of contacts 54 is the same as the center-to-center spacing of the filaments in the lead assembly.

Fingers 48 are located relative to support 52 to locate each filament 32 extending across a narrow chip contact slot 28 immediately above a chip contact 54 as illustrated. With the assembly in alignment with the chip fingers 48 are moved toward support 52 to locate the lead assembly 10 with filaments in slots 28 each immediately above a chip pad 54. Bonding tooling 50 is then lowered into the four slots 28 to engage and presses filaments 32 against the pads 54 to form a reliable permanent electrical connection between each filament and each pad, independent of the adjacent filaments and pads.

Tooling 56 first forces the surfaces of filaments 32 against pads 54 forming initial small area contacts with the pads and then welds the filaments to the pads, typically by compression bonding. If the filaments are flattened surfaces 37 are moved into flush contact with pads 54 without lateral shifting. The initial small contact area between the filaments and the pads is an improvement over the conventional flat large area contacts formed between conventional tabs and chip pads. The unreliability of large area contacts between the ends of tabs and pads has required adding of rounded projections on the flat tabs in order to provide a desired initial point contact. The desired initial small area contact is inherent in connections formed between the small diameter filaments and circuit board and substrate pads.

Following bonding of the filaments in the narrow slots 28 on all four sides of the lead assembly to the corresponding pads on the chip tooling 56 is withdrawn, the lead assembly and chip are removed from support 52 and the lead assembly is inverted and remounted on fingers 48 for bonding to pads o circuit board 60.

Figure 13:
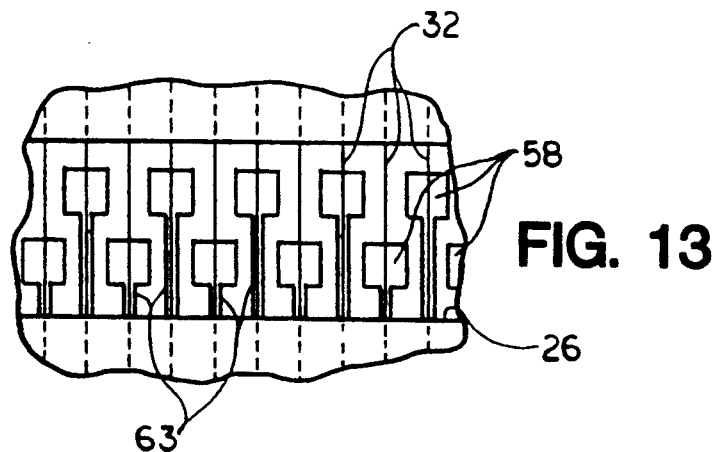
FIG. 13 is an enlarged view of the contact pads on the circuit board shown in FIG. 12.

The remounted lead assembly 10 is positioned over the circuit board 60 with the four large windows 26 positioned over four staggered rows of printed circuit pads 58 located o board 60 and arranged in a square pattern like the pattern of windows 26. The pads 58 ar connected to printed circuit lines 63 extending to other circuit elements mounted on board 60. Pads 58 are considerably larger than the pads 54 on the chip and are staggered to provide an individual pad for each contact filament 32. As shown in FIG. 13, each filament 32 extends over one of the pads 58.

Figure 14:
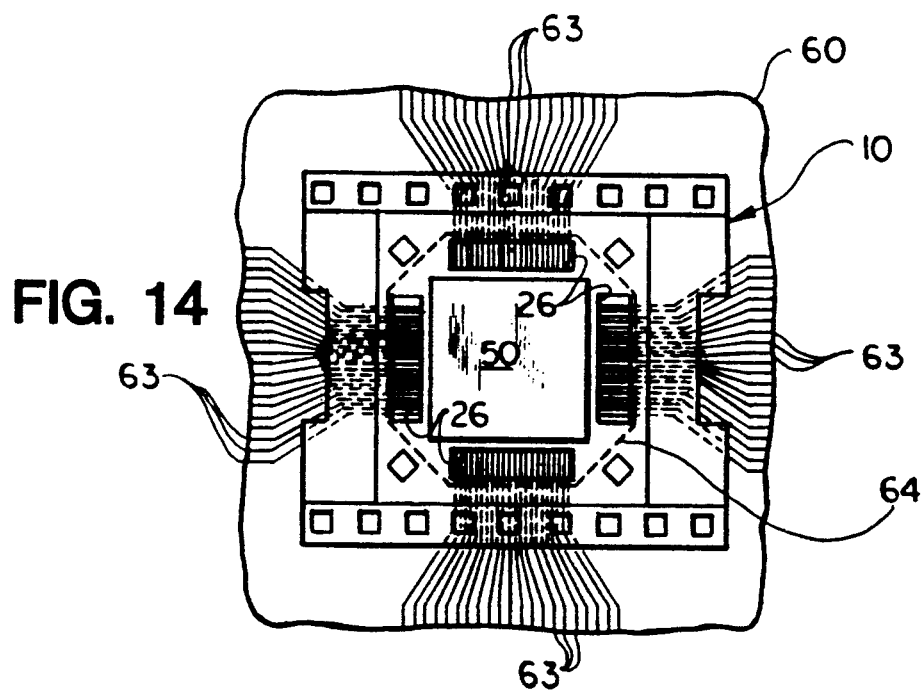
FIGS. 14 and 15 are top views showing the steps in securing the lead assembly and mounted chip to a circuit board.

During the next step the lead assembly 10 is lowered directly onto the board 60 and individual bonding tools 62, like bonding tooling 56, are lowered to engage the filaments 32 in windows 26 and bond the filaments to the pads 58. The filaments may be bonded one at a time using a small tool 62 which is moved to appropriate bonding locations along each window by a programmable drive (not illustrated). FIG. 14 is a top view showing board 60 with lead assembly 10 in place on the board and with arrays of lines 63 extending outwardly from each wide window 26 Following bonding of the filaments to the circuit leads 63 the portions of the tape and sandwiched filaments 32 extending outwardly of the octagonal line 64 are broken away from the inner portion of the lead assembly 10 to form finished lead assembly 10 shown in FIG. 15. Breaking away of the outer portion of the tape sandwich breaks the thin filaments 32 extending across line 64 without forming connections between the individual filaments.

Integrated circuit chips 50 may have a thickness of 0.012 inch or less, thereby permitting use of lead assembly 10 to form electrical connections between the chip and circuit board where the chip is mounted above the board as illustrated in FIG. 15 with pads facing the board or in other locations on the board and also when the chip is positioned on the board with pads facing away from the board.

Figure 19:
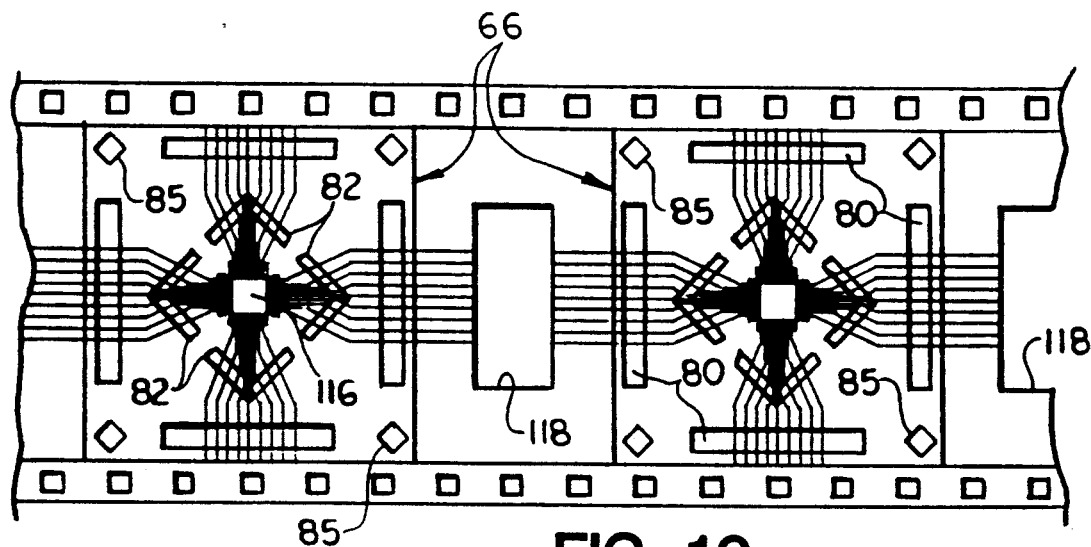
Figure 20:
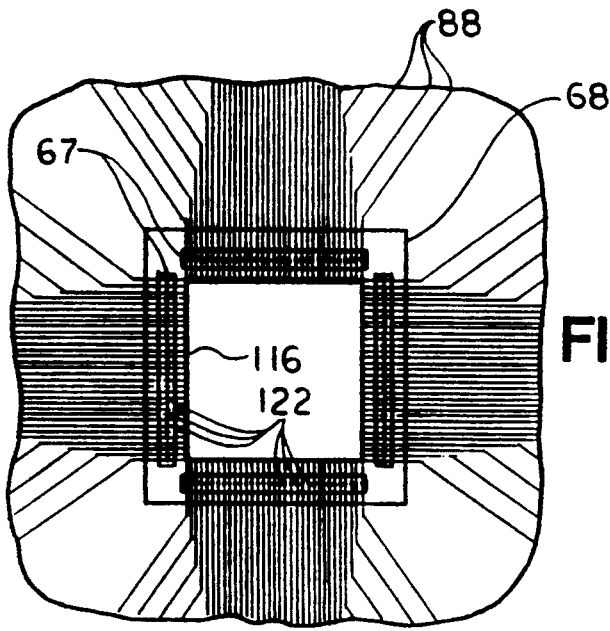
Figure 21:
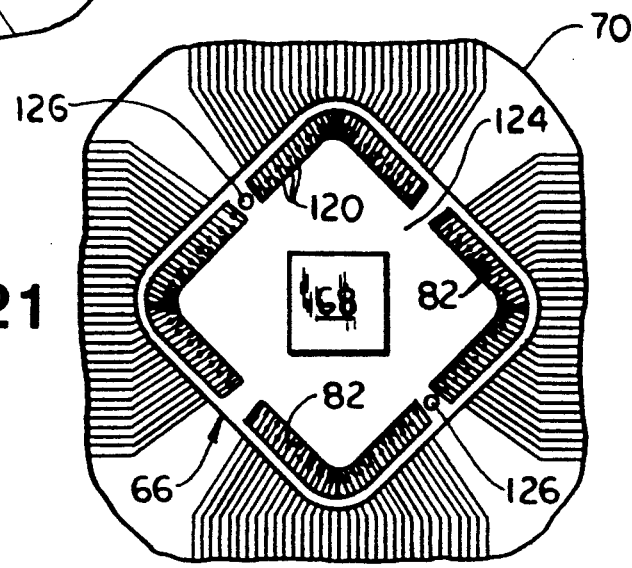

FIGS. 16 through 21 relate to a second embodiment of the invention in which lead assembly 66 shown in FIG. 21 forms electrical connections between rows of very closely spaced contact pads extending along the edges of square integrated circuit chip 68 and staggered rows of contacts on circuit board 70.

The contacts on the circuit board 70 are arranged in a square pattern which is rotated 45 degrees with respect to the contact pads on chip 68. The contact pads on the circuit board may have the same or greater spacing than pads 58 of board 60. The wire filament used in lead assembly 66 is like filament 32 used in lead assembly 10 and may have a diameter as small as 0.001 inch. The filaments are fanned inwardly from the circuit board pads to a close parallel spacing into the edges of the pads on chip 68 where the filaments have a center-to-center spacing of from 0.004 to 0.006 inch. A larger spacing may be used if required. The lead assembly may accommodate greater fanning or spreading of the filaments outwardly of the chip to form connections with widely spaced circuit board pads.

Figure 16:
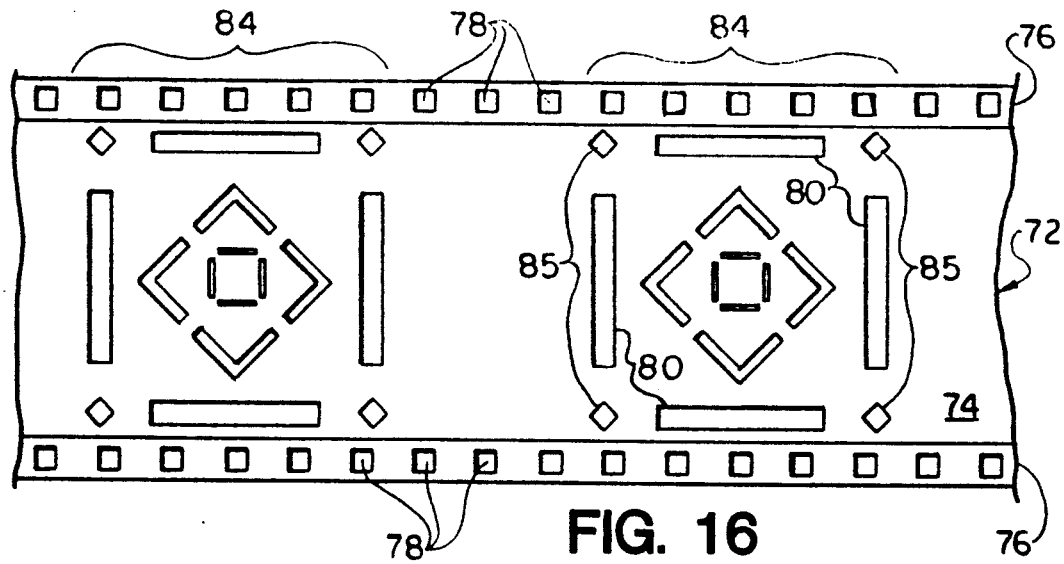
FIGS. 16-21 illustrate the manufacture of a second embodiment lead assembly with inwardly fanned filament conductors for forming electrical connections between the contact pads on the circuit board and pads on a integrated circuit chip where the chip pads are more closely spaced than the pads on the circuit board.

FIG. 16 illustrates a length of tape 72 like tape 12 having a central portion with an adhesive 74 like adhesive 20 and edge strips 76 like strips 16 carrying pilot holes 78 to facilitate movement of the tape during manufacture of the lead assembly. Tape 72 is manufactured from the same material as tape 12.

Four wide slots or windows 80 are punched through the center of tape 72 at each lead assembly interval 84. The windows 80 are arranged in a square pattern as shown with two of the windows extending along the length of the tape and two extending transversely across the tape. Narrower 90 degree angled slots or windows 82 are also punched through the tape inside of windows 80. The slots 82 are arranged in a square pattern rotated 45 degrees with respect to a square of slots 80. Four narrow slots or windows 67, like windows 28, are punched through tape 72 in the center of each portion 84. The windows 67 are arranged in a square pattern with sides parallel to windows 80. Four alignment holes 85 are punched through tape 72 at diagonally opposed locations between adjacent windows 80.

Figure 17:
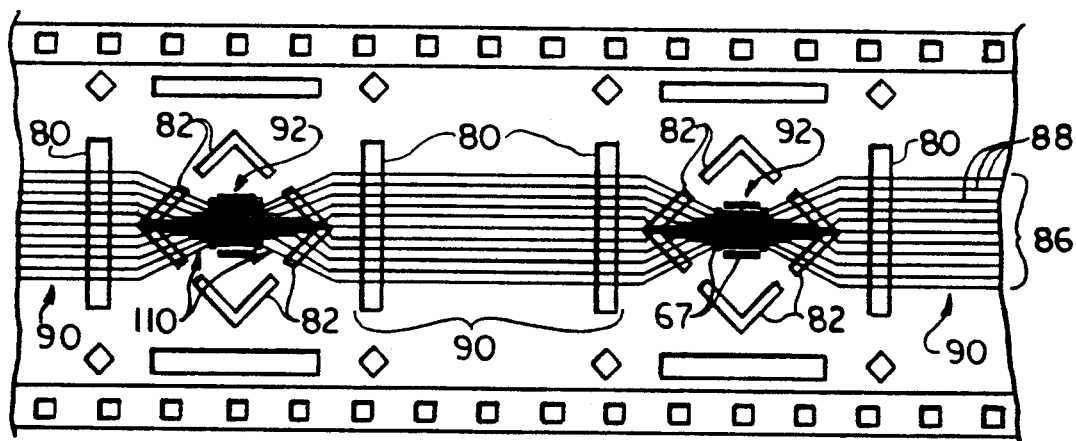

An array 86 of parallel and inwardly fanned individual filaments 88 is bonded to the adhesive of tape 72 as illustrated in FIG. 17. The filaments 88 are parallel with center to center spacings of 0.010 inch or greater at widely spaced parallel portions 90 which extend between adjacent wide slots 80 and a slight distance inwardly from the slots. From the ends of the parallel portions 90 the filaments are fanned inwardly toward each other and extend across a pair of slots 82 to a central closely spaced parallel portion 92 located between slots 82. The filaments in the central portion are spaced apart center-to-center between 0.004 to 0.006 inches and extend across a pair of slots 67.

Figure 22:
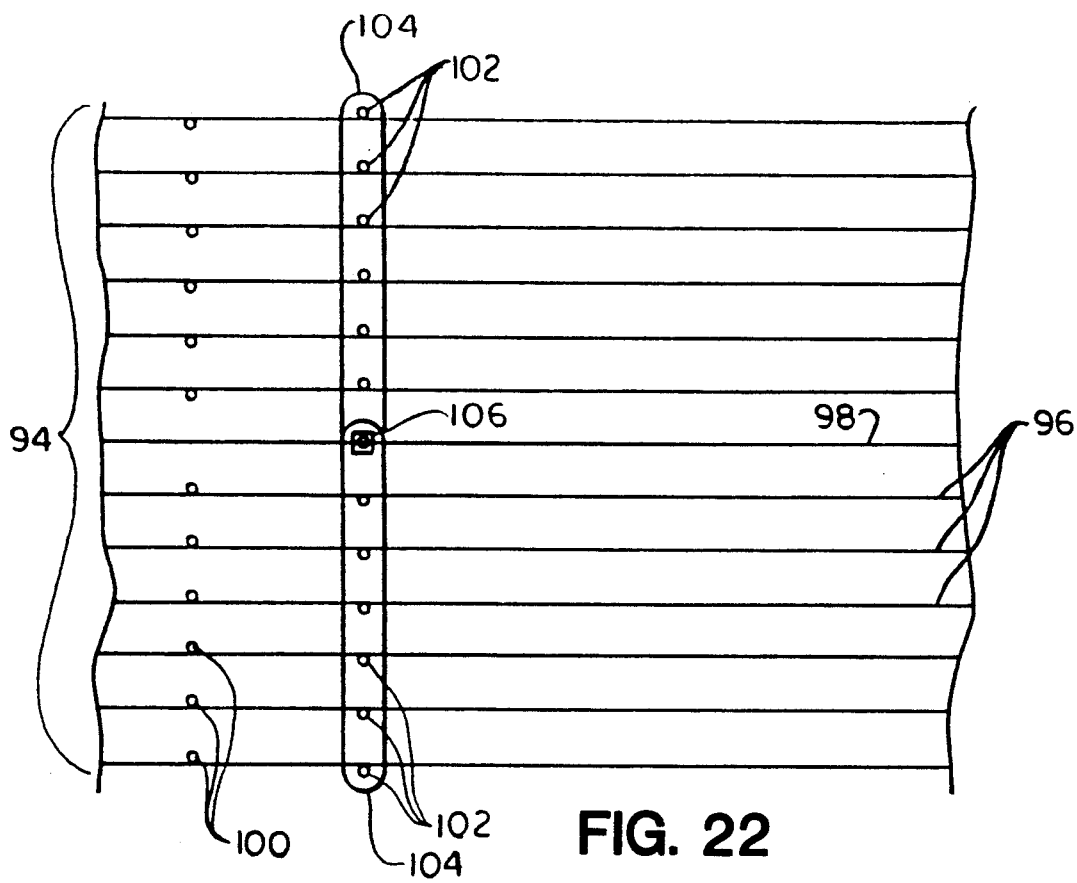
FIGS. 22 and 23 illustrate tooling for inwardly fanning the filaments of the second embodiment lead assembly.
Figure 23:
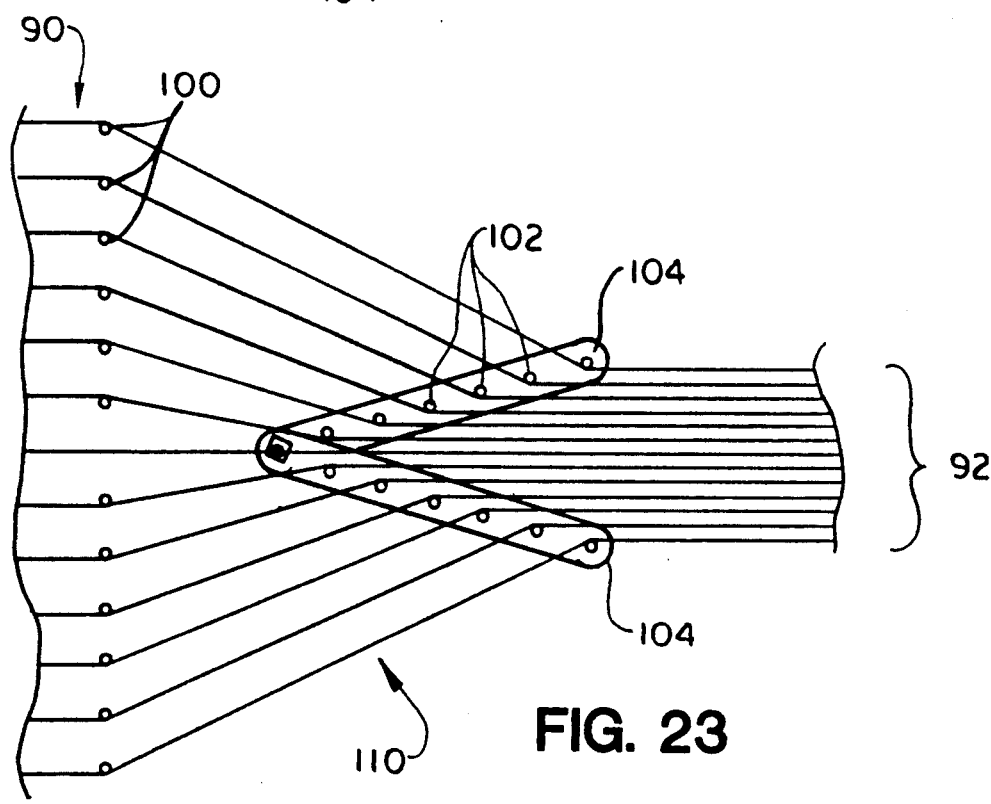

FIGS. 22 and 23 illustrate tooling used to make the parallel and inwardly fanned array 86. These figures illustrate tooling for inwardly fanning one half of the array at one side of a lead assembly interval. Two sets of tooling as shown are used to inwardly fan the parallel array at each lead assembly interval 84.

FIG. 22 illustrates an array 94 of parallel individual lead wire filaments 96 like the filaments 32 used in the first embodiment lead assembly. Filaments in the array include a central filament 98 and a series of filaments located to either side of the central filament. The filaments to either side of the central filament 98 pass outside of a series of comb or fixed pins 100 and inside a series of movable pins 102. The pins 102 to each side of filament 98 are mounted on separate arms 104 which are joined together at pivot connection 106.

The filaments 96 at the other end of the lead assembly interval extend past pins 100 and 102 and arms 104 of the other half of the tooling, with the fixed pins 100 located at the outer end of the interval and the arms located adjacent each other to either side of the center of the interval. The filaments 96 are maintained taut but are connected to filament sources that supply additional filament to the array during the inward fanning operation as needed.

The filaments 96 at the lead assembly interval are fanned inwardly by rotating the two pairs of arms 104 toward the center of the interval as shown in FIG. 23 so that pins 102 move the outer filaments inwardly to form central closely spaced parallel filament portion 92 located between the two sets of pins 102. Pins 102 are regularly spaced along the arms 104 and thereby maintain the parallel spacing of the filaments in portion 92. During inward fanning of the filaments the individual filaments are lengthened and fed into the array from filament sources. Pairs of arms 104 are preferably rotated together and through the same angle to form the collapsed and closely spaced portion 92.

The closely spaced filament portion 92 is connected to the widely spaced parallel array 94 by an inwardly fanned or transition filament portion 110 extending between pins 100 and 102. Array 94 ends at a line extending perpendicularly across array defined by pins 100. The transition portion extends from this line to an angled line defined by pins 102 which also defines the angled edge of the central closely spaced filament array 92. This line has two straight segments corresponding to pins on each arm 104. The segments intersect at an arcuate angle at pivot 106.

After collapsing of the filaments 96 to form parallel center portion or array 92 and inwardly fanned transition portions 110, as described, the filaments are adhered to the adhesive on tape 72 as shown in FIG. 17 with the center portions 92 located centrally within the angled slots 82 and crossing two slots 67, the transition portions 110 extending across the end slots 82 and the filaments 96 in the parallel array 90 extending across wide slots 80. The filaments extending across the wide slots may have a center to center spacing of 0.010 inch or greater, the filaments extending across the angled slots 82 are spaced closer together and the filaments crossing narrow slots 67 are closely spaced. Filaments 96 may be adhered to the adhesive on tape 72 by positioning two sets of tooling at either end of each lead assembly interval closely above the adhesive, transferring the collapsed individual filaments 86 into contact with the adhesive without shifting and then withdrawing the tooling to remove the pins from the filaments. This operation may be performed in a production line having a number of sets of tooling cooperable with a filament feeding apparatus which supplies a continuous parallel array of filaments 94 to the tooling for forming successive sets of collapsed arrays as described and a tape feeding apparatus. The arrays may be moved downstream and brought into contact with synchronized downstream moving tape to transfer the arrays to the tape at proper lead assembly intervals as described.

Figure 18:
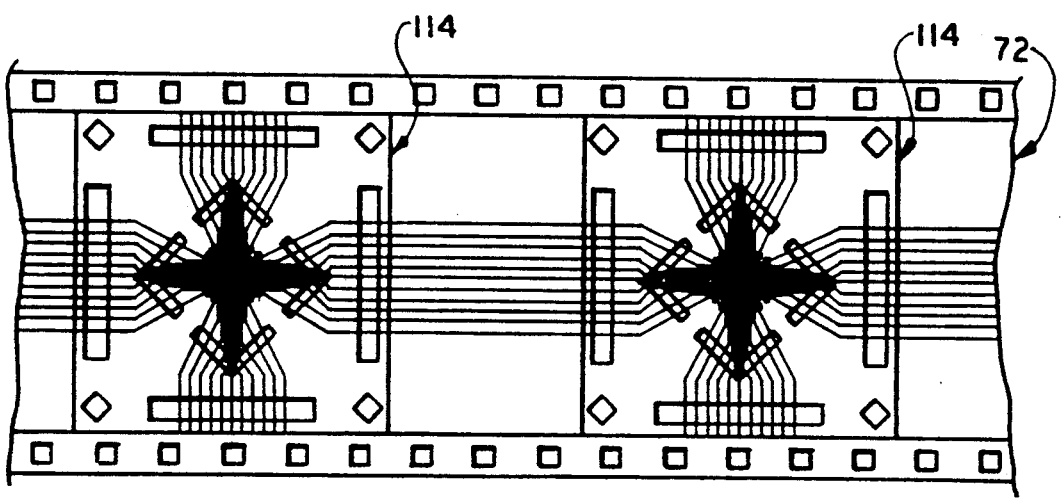

Following application of the inwardly fanned filament array to tape 72 as shown in FIG. 17 the filaments in windows may be flattened to provide flat pad contact surfaces 37 as previously described. Individual tape segments 114, similar to segments 34 shown in FIGS. 5 and 6, are severed from the tape, and edge strips 76 are broken away from the segments. The segments are rotated 90 degrees and placed above lead assembly intervals 84 and filaments and adhered to the tape as shown in FIG. 18. The segments 114 are bonded to tape 72 in the same manner as described in connection with first embodiment lead assemblies. Segments 114 are positioned on tape 72 so that the slots 67, 80 and 82 and alignment openings 85 in the tape and segment are positioned over each other. The collapsed parallel filaments 92 intersect each other at the center of the lead assembly.

FIG. 19 is similar to FIG. 18 but shows the tape 72 after intersecting closely spaced filaments at the center of the lead assembly have been stamped out at square cut out 116 located inside slots 67 and a long slot 118 has been formed in the tape between adjacent lead assembly intervals 84 to electrically isolate the individual filaments in each lead assembly 66 and permit electrical continuity testing.

FIG. 20 is an enlarged view of the center portion of lead assembly 66 showing the inner ends of inwardly fanned filaments 88 extending perpendicularly to the edges of square cut out 116. Integrated circuit chip 68 is provided with rows of closely spaced contact pads 122 along each chip edge. The ends of filaments 88 in slots 67 are spaced closely spaced together with one filament extending over each IC contact pad 122 as illustrated. The filaments are bonded to the chip pads as previously described. During the bonding operation the chip 68 is held in an appropriate support, similar to support 52 and the lead assembly 66 is held by fingers (not illustrated) which extend into the alignment openings 85. If desired, chip 68 may be surrounded and protected by a molded plastic chip carrier 124 having legs 126 extending through the tape.

Following bonding of chip pads to the lead assembly filaments the individual assemblies are severed from tape 72. The filaments extending through the slots 80 are widely spaced apart and may be used to test the circuitry in chips 68 and the bonded connections between the filaments and chip pads. Following testing the lead assemblies are positioned above a circuit board 70 and exposed filaments extending through the relatively narrow angled windows 82 are bonded to pads on the circuit board as described and shown in connection with the first embodiment lead assembly. Alternatively, the filaments extending through wide slots 80 may be bonded to pads on the circuit board leaving the filaments extending across the narrow slots 82 available for postmounting testing of the chip and lead assembly.

Following bonding of the filaments in slots 82 to pads on the circuit board the portion of the lead assembly 66 located outwardly of the slots 82 is broken away as previously described without disturbing the filament-circuit board connections 120 illustrated in FIG. 21.

Figure 24:
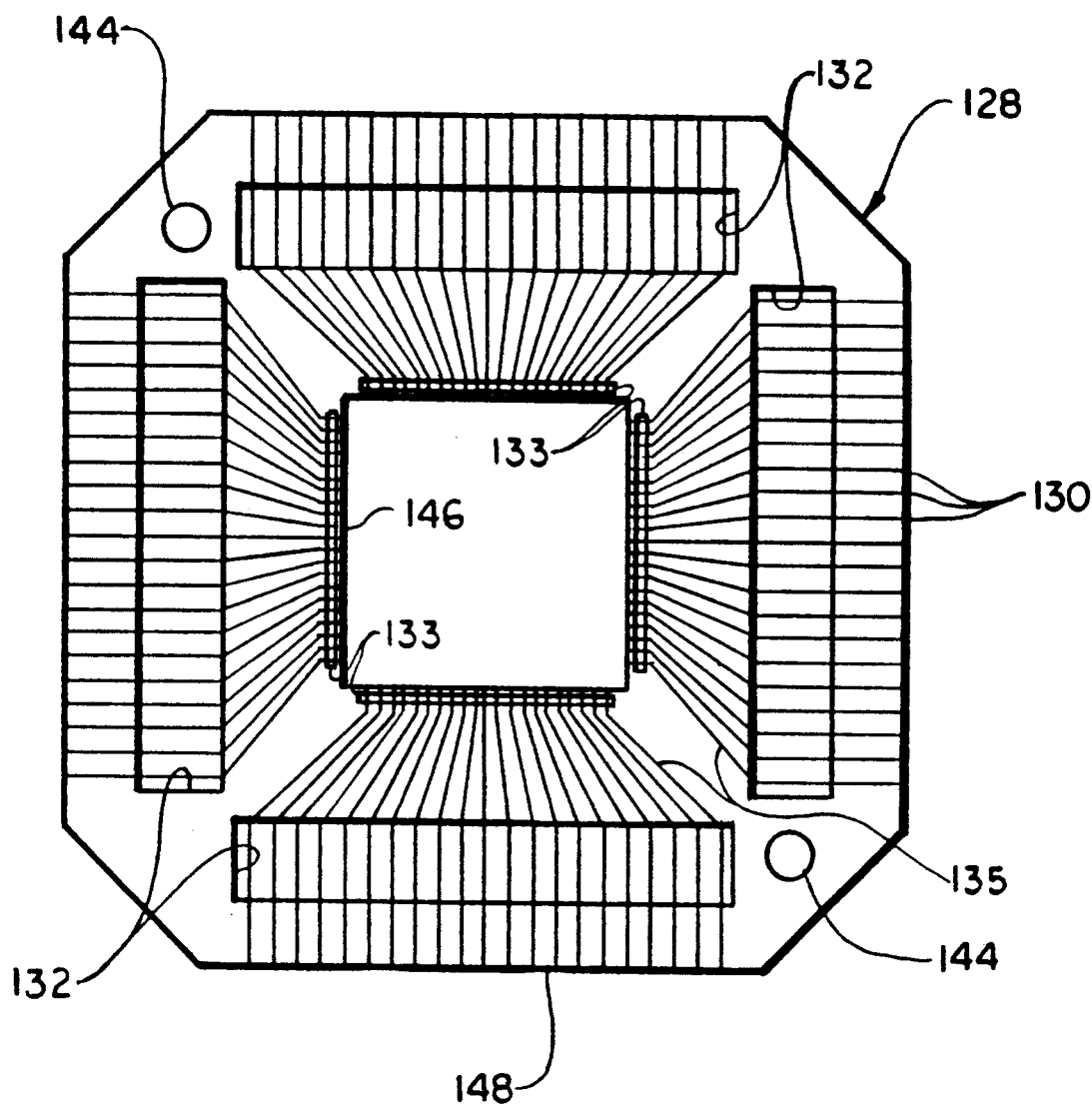
FIG. 24 illustrates a third embodiment lead assembly similar to the second embodiment lead assembly but in which the filaments are fanned inwardly in a different pattern.
Figure 25:
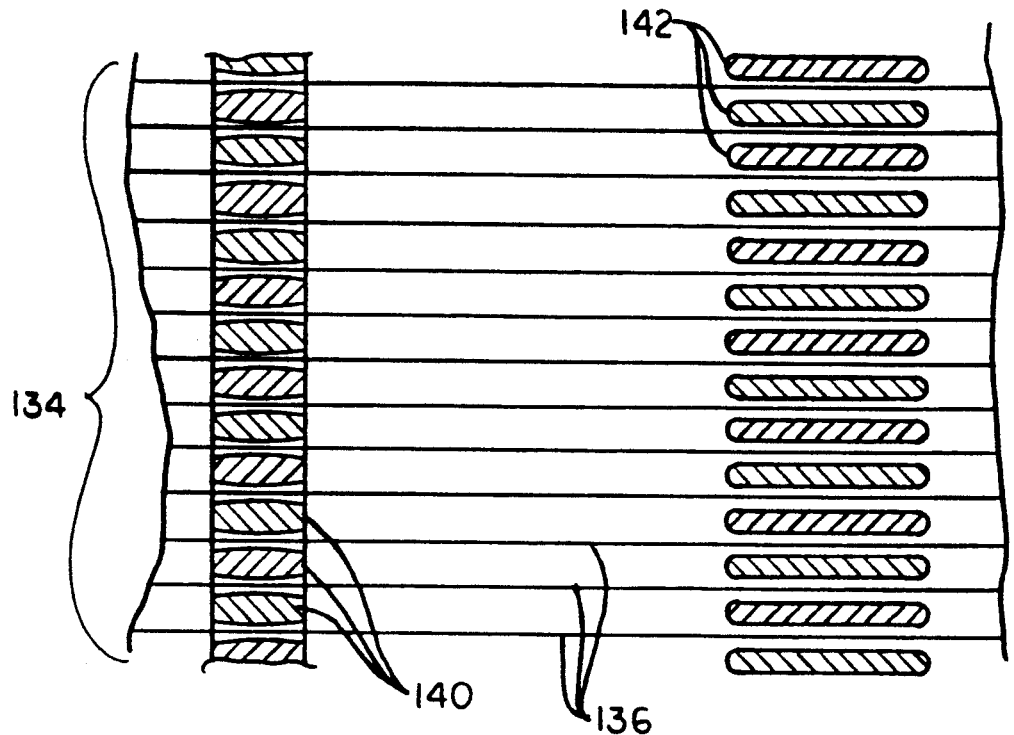
FIGS. 25 and 26 illustrate tooling for inwardly fanning of the filament conductors of third embodiment lead assembly.
Figure 26:
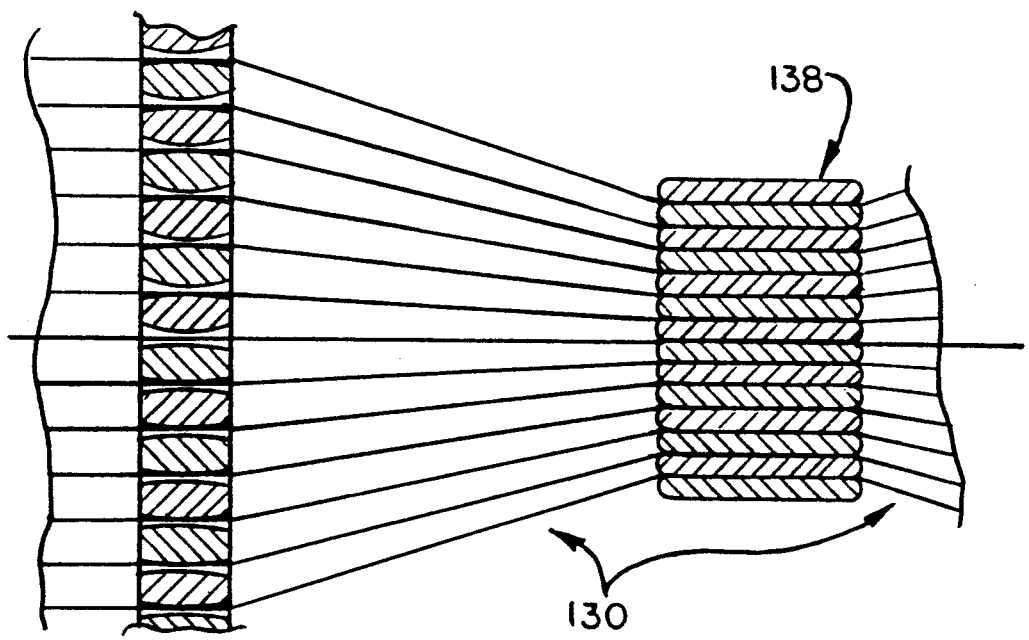

FIGS. 24, 25 and 26 relate to a third embodiment lead assembly 128 in which the individual small diameter wire filaments 130, similar to filaments 32 and 88 of the first two embodiments, are fanned inwardly using comb and blade assemblies as shown in FIGS. 25 and 26 to provide filament transition portions 135 with inner edges extending transversely to the filament array, as opposed to the angled inner edges of portions 110.

The lead assembly 128 is manufactured from an indefinite length section of tape similar to tape 12 having an adhesive applied to the center of one side of the tape. Four wide slots 132 are punched through the tape at regular lead assembly intervals along the length of the tape. A parallel array 134 of small diameter filaments 136 is inwardly fanned as shown in FIGS. 25 and 26 to provide a closely spaced central parallel array 138.

The parallel filaments at each end of the lead assembly interval are fed through two sets of fixed comb tines 140 (only one set of tines is illustrated) and extend through a series of closely spaced thin, fanning blades 142 located between the combs. The array 138 and filament transition portions 130 are formed by moving blades 132 together as shown in FIG. 26 so that the flat blades sandwich the filaments into a closely spaced parallel array 138. As the filaments are moved together additional lengths of filament are fed into the combs 140. The resultant filament transition portions 135 are defined by ends extending perpendicular to the length of the parallel array. This shape transition portion is believed to be preferable to the nonlinear angle transition portion used in the second embodiment lead assembly because of reduced interference between adjacent filaments.

Following inward fanning of the filaments as described, the fanned filaments are adhered to the adhesive on the tape at each lead assembly location with the parallel filaments located outwardly of the transition portion 130 extending across the two slots 132 which extend transversely at each interval and the collapsed filaments in array 138 extending across two slots 133. Tape segments are severed from the carrier strip and are rotated 90 degrees, inverted and then adhered to the tape at each lead assembly interval along the tape to form lead assembly assemblies as previously described. Parallel arrays 138 extending perpendicularly across each other at the center of the assemblies and across slots 133. Filament transition portions 135 extend outwardly from each side of the center to each of the four slots 132 with the parallel array of filaments extending perpendicularly across the slots 132. Alignment holes 144 extend through both tape segments.

In the next step the central portion of each lead assembly is punched away to form a square cut out 146 with ends of the filaments extending perpendicularly to and along the edges of the cutouts as illustrated. Slots are also formed through the tape to separate the filaments in adjacent lead assembly assemblies.

After testing of the lead assembly assemblies 128, the assemblies are severed from the tape and electrical connections are formed between the inner closely spaced filament ends at the edges of the cutout 146 and an integrated circuit chip, as previously described. The lead assembly is then positioned on a circuit board and the individual filaments extending across the slots 132 are bonded to circuit board pads as also previously described. The remainder of the tape located outside of line 148 is broken away as a final step.

Lead assembly 128 is preferably manufactured using the same small diameter 0.001 inch wire filament as used in the previously described lead assemblies. The chip contact ends of the filaments at slots 133 may have center to center spacing as small as 0.004 or 0.006 inch with filament spacing at slots 132 being as great as 0.010 inch or larger.

All of lead assemblies 10, 66 and 128 are used for forming electrical connections between circuit board pads and integrated circuit pads located on all four sides of a square or rectangular chip. Other types of chips or circuit elements may be provided with the contact pads on two opposing sides, or in some cases with pads extending along single side only. It is contemplated that lead assemblies, or portions of lead assemblies, as described may be used for forming electrical connections between the contact pads on these types of chips or elements and pads supporting circuit boards, panels and the like. Thus, the invention encompasses lead assemblies having single arrays of parallel or inwardly fanned wire filaments adhered to a supporting tape. Lead assemblies of this type may not include a second tape segment carrying a second array of filaments extending generally perpendicular to the first array. Lead assemblies carrying a single array of filaments may be cut into individual contact segments which may then be bonded to single rows of chips and circuit board pads.

While I have illustrated and described a preferred embodiment of my invention, it is understood that this is capable of modification, and I therefore do not wish to be limited to the precise details set forth, but desire to avail myself of such changes and alterations a fall within the purview of the following claims.

What I claim as my invention is:

1. The method of manufacturing a lead assembly for forming electrical connections between contact pads on a board and closely spaced contact pads on an integrated circuit chip comprising the steps of:
   a. stringing a plurality of individual conductive wire filaments in generally parallel side-by-side relation to form an array of parallel filaments remote from the tape segments;
   b. providing first and second tape segments remote from the array of parallel conductive wire filaments;
   c. adhering portions of the filament array to the first and second tape segments so that each segment carries an array of generally parallel wire filaments extending across the segment;
   d. positioning one segment on top of the other segment with the filaments in the respective arrays on the segments oriented at approximately 90 degrees to each other and adhering the two tape segments to each other; and
   f. forming a series of chip contact ends on the filaments of each segment array, such ends being located at a chip location on the tape segments and forming board contact ends on the filaments of each segment array, such ends being located away from the chip location.

2. The method of claim 1 including the step of positioning the tape segments with filament arrays intersecting each other at the chip location and removing intersecting filaments.

3. The method of claim 1 including the step of forming flat contact surfaces on the contact ends of the filaments.

4. The method of claim 1 including the steps of forming openings through a tape segment at the chip contact ends and at the board contact ends and bonding the chip contact ends to contact pads on an integrated circuit chip and bonding the filament board contact ends to contact pads on a circuit board with the bonds extending through the openings.

5. The method of claim 1 including the step of inwardly fanning the filaments in each array prior to adhering the filaments to the first and second tape segments so that the chip contact ends are more closely spaced apart than the board contact ends.

6. The method of claim 1 including the including the step of spacing the filaments forming said chip contact ends apart a distance approximately 0.004 to 0.006 inch.

7. The method of claim 1 including the step of positioning the segments so that said arrays intersect each other at a central chip location and removing the intersecting filaments and tape bonded to the intersecting filaments from the lead assembly to form four filament arrays each extending outwardly from the chip location.

8. The method of claim 7 including the step of forming openings in said tape segments at the filaments and extending said filament ends across openings prior to adhering the filaments to the tape segments.

9. The method of claim 8 including the step of forming parallel chip contact ends spaced apart about 0.004 to 0.006 inch, inwardly fanning the filament arrays adjacent such ends and forming straight line connections between the closed spaced inwardly fanned filaments and the chip contact ends.

10. The method of claim 8 including the step of forming parallel chip contact ends spaced apart about 0.004 to 0.006 inch, inwardly fanning the filament arrays adjacent such ends and forming a non-linear line connection between the chip pad ends and the inwardly fanned filaments.

11. The method of claim 1 including the step of adhering the filaments to an indefinite length tape strip and severing said film segments from the tape strip.

12. The method of manufacturing a lead assembly for forming electrical connections between contact pads on a board and closely spaced contact pads on an integrated circuit chip using cylindrical wire filaments comprising the steps of:
   a. adhering two side-by-side arrays of generally parallel conductive cylindrical wire filaments oriented generally perpendicular to each other to a tape segment with central portions of said filament arrays intersecting each other at a chip location; and
   b. removing the intersecting portions of the filament arrays and the adhered portion of the tape segment at the chip location to form at least of pair of generally perpendicular arrays of individual filaments having chip contact ends adjacent the chip location and board contact pads located away from the chip location.

13. The method of claim 12 including the step of inwardly fanning said arrays.

14. The method of claim 13 including positioning the board contact ends of said arrays at a center-to-center spacing of about 0.015 to 0.025 inch.

15. The method of claim 12 including the step of positioning the chip location at the center of the tape segment, and removing the intersecting filaments and a rectangular portion of the tape segment at the chip location to form four filament arrays.

16. The method of claim 12 including the step of positioning the chip contact ends in each array at a center-to-center spacing of about 0.004 to 0.006 inch and inwardly fanning said arrays between the board contact ends and the chip contact ends.

17. The method of manufacturing a lead assembly for forming electrical connections between contact pads on a board and closely spaced contact pads on an integrated circuit chip comprising the steps of adhering two arrays of side-by-side and inwardly fanned conductive cylindrical wire filaments having a diameter of about 0.001 to 0.003 inch to a tape segment to either side of a chip location with each array including a row of board contact ends exposed through the thickness of the tape segment away from the chip location and a row of chip contact ends exposed through the thickness of the tape segment adjacent to the chip location with the filaments in each array being inwardly fanned between the board contact ends and the chip contact ends so that the chip contact ends are spaced more closely together than the board contact ends; and removing portions of the tape carrier at such ends.

18. The method of claim 17 including forming slots through the tape segment to expose the ends of the filaments.

19. The method of claim 18 including the step of forming flat contact surfaces on ends with the contact surfaces facing outwardly from the tape segment.

* * * * *